(12) United States Patent
Sakka et al.

(10) Patent No.: US 8,940,128 B2
(45) Date of Patent: Jan. 27, 2015

(54) PLASMA PROCESSING APPARATUS

(75) Inventors: Yusaku Sakka, Shunan (JP); Ryoji Nishio, Kudamatsu (JP); Ken Yoshioka, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 1056 days.

(21) Appl. No.: 12/853,427

(22) Filed: Aug. 10, 2010

(65) Prior Publication Data

US 2011/0297320 A1 Dec. 8, 2011

(30) Foreign Application Priority Data

Jun. 2, 2010 (JP) ................................. 2010-126411

(51) Int. Cl.
*C23C 16/505* (2006.01)
*H01J 37/32* (2006.01)
(Continued)

(52) U.S. Cl.
CPC ................ *H05H 1/46* (2013.01); *H01J 37/321* (2013.01); *H01J 37/3211* (2013.01); *H01J 37/32651* (2013.01); *H05H 2001/463* (2013.01)
USPC .............. 156/345.44; 156/345.48; 118/723 I; 118/723 R; 118/723 AN

(58) Field of Classification Search
CPC . H01J 37/321; H01J 37/3211; H01J 37/3219; H01J 37/32651; H01J 37/32174; H01J 37/32183; H05H 2001/4652; H05H 2001/4667; H05H 2001/4682; C23C 16/505; C23C 16/507
USPC .......... 156/345.44, 345.48; 118/723 I, 723 R, 118/723 AN
See application file for complete search history.

(56) References Cited

U.S. PATENT DOCUMENTS

| 5,907,221 A * | 5/1999 | Sato et al. ................ 315/111.51 |
| 2002/0125828 A1 * | 9/2002 | Doi et al. ................ 315/111.21 |

(Continued)

FOREIGN PATENT DOCUMENTS

| JP | 08064394 A * | 3/1996 |
| JP | 2001140085 A * | 5/2001 |

(Continued)

OTHER PUBLICATIONS

Lieberman, Michael A., Lichtenberg, Allan. "Principles of Plasma Discharges and Materials Processing. Second Edition" 2005. Wiley & Sons. pp. 431-434, section 11.4.*
Michael A. Lieberman et al., Principles of Plasma Discharges and Materials Processing, ED Research, Chapter 11, P. 274 1.6-1.21 and table 11.1.

*Primary Examiner* — Jeffrie R Lund
*Assistant Examiner* — Yuechuan Yu
(74) *Attorney, Agent, or Firm* — Antonelli, Terry, Stout & Kraus, LLP.

(57) ABSTRACT

The invention aims at suppressing the self bias generated at the surface of the inner wall of the vacuum processing chamber, to thereby suppress the chipping of the inner wall surface of the vacuum processing chamber or the consumption of the inner parts of the vacuum processing chamber. The present invention provides a plasma processing apparatus comprising a vacuum processing chamber, a vacuum processing chamber lid sealing an upper portion of the vacuum processing chamber, an induction antenna, a Faraday shield disposed between the induction antenna and the vacuum processing chamber lid, and a high frequency power supply for supplying high frequency power to the induction antenna, wherein the induction antenna is divided into two or more parts, the Faraday shield is divided into a division number corresponding to the division number of the induction antenna, and high frequency voltages are applied thereto via a matching box from the one high frequency power supply.

3 Claims, 10 Drawing Sheets

(51) Int. Cl.
  *C23C 16/507* (2006.01)
  *H05H 1/46* (2006.01)
  *H05H 1/36* (2006.01)

(56) References Cited

U.S. PATENT DOCUMENTS

| | | | |
|---|---|---|---|
| 2003/0160024 A1 | 8/2003 | Kawaguchi et al. | |
| 2005/0199343 A1* | 9/2005 | Ohkuni | 156/345.48 |
| 2006/0254518 A1* | 11/2006 | Ellingboe | 118/723.001 |
| 2008/0011425 A1* | 1/2008 | Nishio et al. | 156/345.48 |
| 2010/0080933 A1* | 4/2010 | Kudela et al. | 427/574 |

FOREIGN PATENT DOCUMENTS

| | | | |
|---|---|---|---|
| JP | 2002184766 A * | 6/2002 | |
| JP | 2003-243362 | 8/2003 | |
| JP | 2004-235545 | 8/2004 | |
| JP | 2005175503 A * | 6/2005 | |
| JP | 2005-259836 | 9/2005 | |
| JP | 2008060258 A * | 3/2008 | |
| KR | 10-2010-0041103 | 4/2010 | |

* cited by examiner

PLASMA PROCESSING APPARATUS

The present application is based on and claims priority of Japanese patent application No. 2010-126411 filed on Jun. 2, 2010, the entire contents of which are hereby incorporated by reference.

BACKGROUND OF THE INVENTION

1. Field of the Invention

The present invention relates to a plasma processing apparatus, and more specifically, relates to a plasma processing apparatus capable of suppressing the occurrence of particles caused by reaction products.

2. Description of the Related Art

In the field of manufacturing semiconductor devices, plasma processing apparatuses using plasma are adopted as means for realizing microfabrication to respond to the increasing demands for highly precise high-speed microfabrications (such as dry etching), to realize enhanced performance of semiconductor integrated circuit elements and cut down costs. Among such arts, the art of dry etching is often applied, in which processing gas is used to process films deposited on the sample and evacuate the residual gas in the processing chamber via a turbo-molecular pump or the like to the exterior. Various kinds of gases (such as Ar, $Cl_2$ and HBr) can be used as the processing gases, but some gases are not sufficiently evaporated, depending on the kind of films deposited on the sample being processed. In such cases, gases are not sufficiently discharged and become the cause of reaction products, which deposit on the inner wall of the vacuum processing chamber and on the inner wall of an inductive vacuum processing chamber lid disposed on the upper portion of the vacuum processing chamber. When excessive reaction products are deposited on the inner wall of the vacuum processing chamber and the inner wall of the vacuum processing chamber lid, deposition films may fall off from the surface of the inner wall and attach to the surface of the sample as particles.

One type of prior art plasma processing apparatuses is an inductive plasma processing apparatus having a high frequency power supply connected to a coil-like induction antenna disposed on an outer circumference of a vacuum processing chamber lid for supplying high frequency power to the coil-like induction antenna, to thereby generate plasma. The drawback according to this type of plasma processing apparatus adopting an induction antenna is that the bonding state of the induction antenna and the plasma within the vacuum processing chamber lid is varied by the reaction products deposited on the inner wall of the vacuum processing chamber and the vacuum processing chamber lid, by which the etching rate, the uniformity of etching, the perpendicularity of the etching profile and the state of deposition of reaction products on the etched side walls is varied with time.

Next, Japanese patent application laid-open publication No. 2004-235545 (patent document 1) discloses the following method as the method for preventing reaction products from depositing on the inner wall of the vacuum processing chamber lid. A Faraday shield capacitively coupled with plasma is arranged between induction antennas disposed at the outer circumference of a vacuum processing chamber lid and plasma, and high frequency power is supplied to the Faraday shield to generate self bias to the inner wall of the vacuum processing chamber lid, drawing ions in the plasma by the electric field within the ion sheath and sputtering the surface of the inner wall of the vacuum processing chamber lid. The sputtering is used to suppress or remove the deposition of reaction products on the inner wall of the vacuum processing chamber lid, and perform cleaning of the inner wall of the vacuum processing chamber lid. In the present specification, the vacuum processing chamber lid is airtightly fixed to the upper portion of the vacuum processing chamber.

As described, a self bias is generated on the surface of the inner wall of the vacuum processing chamber lid via the high frequency voltage applied to the Faraday shield, by which the electric field of the ion sheath is increased and the energy of ions reaching the inner wall of the vacuum processing chamber lid is enhanced. Therefore, ion sputtering via ions becomes prominent, enabling more reaction products to be cleaned. Further, most appropriate cleaning becomes possible by controlling the high frequency voltage supplied to the Faraday shield.

Further, the following method is disclosed in Japanese patent application laid-open publication No. 2005-259836 (patent document 2) as a method for cleaning the whole surface of the inner wall of the vacuum processing chamber lid in a uniform manner. Patent document 2 discloses a plasma etching apparatus having a Faraday shield divided into multiple parts and providing independent high frequency power supplies respectively to each of the divided Faraday shields, to thereby enable control of the voltages applied to the respective Faraday shields.

According to the disclosed plasma processing apparatus, in order to remove the reaction products generated from samples during etching and thickly deposited on a center portion of the vacuum processing chamber lid (top plate) closest to the sample surface, a high frequency power which is higher than the power supplied to the outer circumference portion of the top plate is supplied to the divided Faraday shield disposed at the center portion of the top plate. According to this arrangement, reaction products deposited both on the center portion and the outer circumference portion of the top plate can be cleaned appropriately.

FIG. 10 shows the state of deposition of reaction products attached to the inner wall of the vacuum processing chamber lid in a plasma processing apparatus. When etching is performed, a large amount of reaction products is generated from the sample being processed, and the generated reaction products are attached to and deposited on the inner wall of the vacuum processing chamber lid (hereinafter referred to as a window 12) and the inner wall surface of a vacuum processing chamber 2 as a film (18).

In contrast, at an outermost circumference portion (portion B) of the inner wall surface of the window 12, the self bias is reduced since the vacuum processing chamber 2 is grounded, so that the energy of ions with respect to portion B is reduced. Ion sputtering rarely occurs in portion B, and therefore, reaction products remain in portion B. As a result, the inner wall surface of the window 12 is divided into a region (portion A) where the reaction products are completely removed, and a region (portion B) where reaction products easily remain.

In order to eliminate residual reaction products in portion B, it is necessary to set the high frequency voltage applied to the Faraday shield 17 (Faraday shield voltage: hereinafter abbreviated as FSV) as high as possible to remove the reaction products deposited on the inner wall of the window 12. According to this method, however, the inner wall surface of the window 12 of portion A is chipped excessively.

As described, if the inner surface of the window 12 is chipped and the speed of consumption of the window 12 itself is increased, the replacement cycle of the window 12 is shortened. Further, the chipped window 12 becomes the source of reaction products and re-deposits on the wafer surface, causing instability of etching rate of the process performance and in-plane unevenness of the wafer etching rate and the like. Another drawback is that the chipped surface of the window 12 turns into particles and attach to the sample surface. Therefore, in order to overcome the above-mentioned problems, it is necessary to remove the reaction products deposited on the whole inner wall surface of the window 12 in a most suitable manner.

Prior arts such as that disclosed in patent document 2 enables to remove the reaction products deposited on the whole inner wall surface of the window 12 in a suitable manner, but since independent high frequency power supplies must be disposed in response to the divided Faraday shields and antennas, the application thereof to industrially-applied plasma processing apparatuses causes increase of costs and requires a large mounting space.

Furthermore, there is a drawback that cannot be solved by the prior art disclosed in patent document 2. This drawback will be described with reference to FIG. 5. Since the present drawback is not related to the division number of Faraday shields, the plasma processing apparatus illustrated in FIG. 5 has a Faraday shield that is not divided into multiple parts.

In FIG. 5, the dotted lines with arrows show high frequency currents flowing from a Faraday shield 17 into the vacuum processing chamber 2 during plasma processing. The Faraday shield 17 is capacitively coupled with plasma, and the high frequency current from the Faraday shield 17 flows through the plasma as shown by the arrows into the vacuum processing chamber 2 being grounded.

Now, when the high frequency voltage applied to the Faraday shield 17 is denoted by $V_a$, the area of the Faraday shield 17 is denoted by $S_a$, the high frequency voltage generated in the ion sheath on the surface of the inner wall of the vacuum processing chamber 2 is denoted by $V_b$, and the surface area of the ion sheath is denoted by $S_b$, the following expression is satisfied, as taught in cited document (Michael A. Lieberman, Allan J. Lichetenberg, ED Research, "Principles of Plasma Discharges and Materials Processing" Chapter 11).

$$\frac{V_b}{V_a} = \left(\frac{S_a}{S_b}\right)^n \quad \text{[Expression 1]}$$

Expression 1 shows that a self bias is not only generated at the inner wall surface of the window 12 by the high frequency voltage applied to the Faraday shield 17, but also generated at the inner wall surface of the vacuum processing chamber 2 into which high frequency current flows.

Therefore, the inner wall of the vacuum processing chamber 2 is sputtered via the ions accelerated by $V_b$. As described, when the inner wall of the vacuum processing chamber 2 is sputtered, the lifetime of the respective parts composing the interior of the vacuum processing chamber 2 is reduced, and the frequency of replacement of the parts is increased. Thus, the running costs of the plasma processing apparatus cased by replacement of parts is increased. Even further, the chipped inner wall of the vacuum processing chamber 2 becomes the source of particles, by which the mass production performance of the plasma processing apparatus is deteriorated.

SUMMARY OF THE INVENTION

The present invention aims at solving the problems of the prior art by providing a plasma processing apparatus capable of suppressing the self bias generated at the inner wall surface of the vacuum processing chamber, to thereby suppress chipping of the inner wall of the vacuum processing chamber and the inner components of the vacuum processing chamber, and suppress the generation of particles by suppressing the chipping of the inner wall of the vacuum processing chamber and the inner components of the vacuum processing chamber.

The present invention provides a plasma processing apparatus comprising a vacuum processing chamber, a vacuum processing chamber lid sealing an upper portion of the vacuum processing chamber, an induction antenna, a Faraday shield disposed between the induction antenna and the vacuum processing chamber lid, and a high frequency power supply for supplying high frequency power to the induction antenna, wherein the induction antenna is divided into two or more parts, the Faraday shield is divided into a division number corresponding to a division number of the induction antenna, and high frequency voltage is applied thereto via a matching box from the one high frequency power supply.

The present invention having the above-mentioned arrangement enables to independently control the respective high frequency voltages applied to the Faraday shields divided into multiple parts. Therefore, the reaction products deposited on the inner wall of the vacuum processing chamber lid can be removed in a uniform manner, according to which the generation of particles can be suppressed, and further, since it is necessary to provide only a single high frequency power supply for applying high frequency power to the divided Faraday shields, the plasma processing apparatus can be downsized.

DETAILED DESCRIPTION OF THE PREFERRED EMBODIMENTS

Now, preferred embodiments for carrying out the present invention will be described with reference to the drawings.

Example 1

Figure 1:
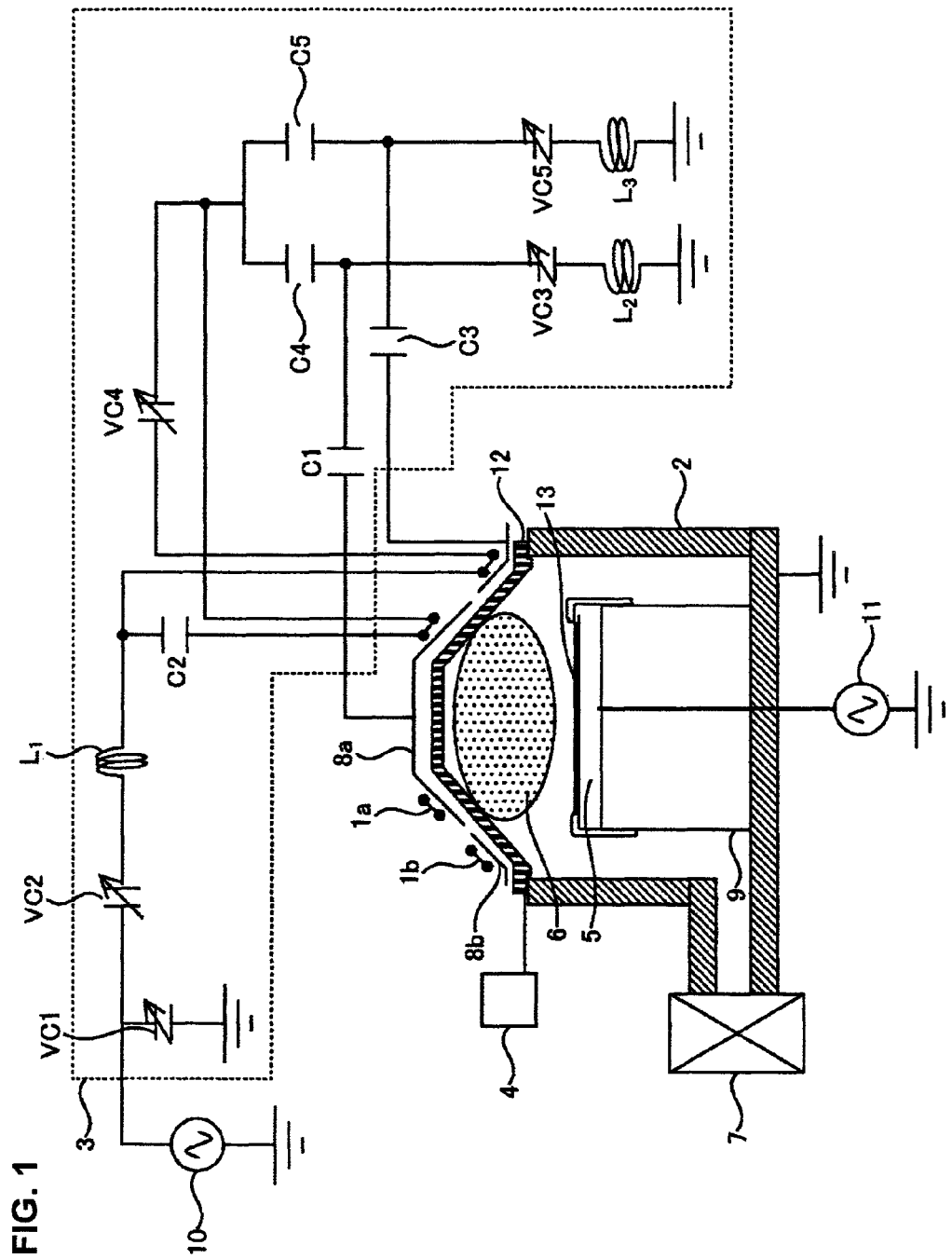
FIG. 1 is a cross-sectional view showing the structure of a plasma processing apparatus according to a preferred embodiment of the present invention.

FIG. 1 is a cross-sectional view showing a plasma processing apparatus according to the present invention.

A window 12 formed of an insulating material (such as $Al_2O_3$) in the shape of a trapezoidal rotating body is disposed to airtightly seal an upper portion of a cylindrical vacuum processing chamber 2, thereby defining the vacuum processing chamber 2. A sample stage 5 is disposed in the interior of the vacuum processing chamber 2 for loading a sample 13 to be processed, and plasma 6 is generated in the interior of the vacuum processing chamber 2 to process the sample 13. The sample stage 5 is formed on a sample holder portion 9 that includes the sample stage 5.

A processing gas is supplied to the interior of the vacuum processing chamber 2 from a gas supply unit 4, and the gas inside the vacuum processing chamber 2 is evacuated and set to predetermined pressure via a vacuum device 7. Plasma 6 is generated from the supplied processing gas through the operation of an electromagnetic field generated via a first induction antenna 1a, a second induction antenna 1b, a first Faraday shield 8a and a second Faraday shield 8b. A second high frequency power supply 11 is connected to the sample stage 5 and high frequency power is applied to the sample stage 5, so as to draw ions within the plasma 6 toward a sample 13.

A first induction antenna 1a and a second induction antenna 1b in the shape of coils are arranged on the outer circumference of the window 12. The respective number of turns of the coils constituting the first induction antenna 1a disposed on an upper side with respect to a center axis of the window 12 and the second induction antenna 2a disposed on a lower side with respect thereto is two turns. Further, it is preferable that the center axes of the first induction antenna 1a and the second induction antenna 1b correspond. High frequency power (such as 13.56 MHz, 27.12 MHz or 2 MHz) generated by the first high frequency power supply 10 is respectively supplied to the first induction antenna 1a and the second induction antenna 2a, by which the antennas irradiate an electromagnetic field for generating plasma 6. At this time, the impedance of the first induction antenna 1a and the second induction antenna 1b is matched with the output impedance of the high frequency power supply 10 via a matching network composed of variable capacitors VC1 and VC2 disposed in a matching box 3. Furthermore, the high frequency current supplied to the induction antenna 1 can be controlled to correspond to each line of the first induction antenna 1a and the second induction antenna 1b via a variable capacitor VC4 disposed in the matching box 3. The distribution of plasma 6 can be controlled in this manner.

The first Faraday shield 8a disposed on an upper side with respect to a center axis of the window 12 and the second Faraday shield 8b disposed on a lower side thereof are formed in the shape of a trapezoidal rotating body, respectively capacitively coupled between the first induction antenna 1a and plasma 6, and between the second induction antenna 1b and plasma 6, and are respectively disposed between the window 12 and the first induction antenna 1a, and between the window 12 and the second induction antenna 1b. Further, the first Faraday shield 8a and the second Faraday shield 8b are disposed on the outer side of the window 12 in FIG. 12, but they can also be disposed on the inner side thereof.

Further, the center axes of the first Faraday shield 8a and the second Faraday shield 8b should preferably correspond to the center axis of the window 12.

Figure 10:
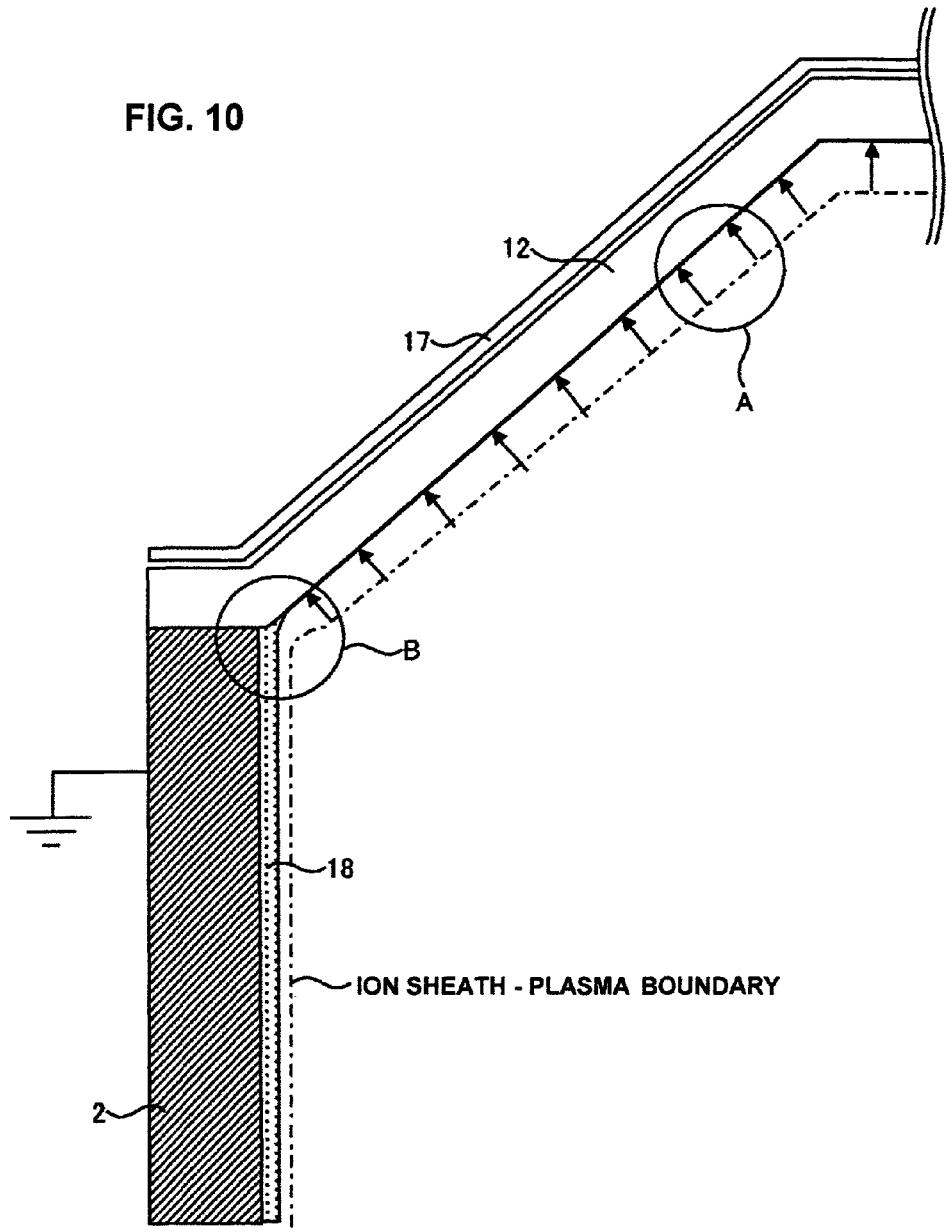
FIG. 10 is a view showing the state of deposition of reaction products attached to the inner wall of the vacuum chamber.

The high frequency voltage respectively applied to the first Faraday shield 8a and the second Faraday shield 8b (Faraday shield voltage: hereinafter referred to as FSV) can be controlled independently via a variable capacitor VC3 (VC5) and a coil $L_2$ ($L_3$) disposed in the matching box 3. For example, if the thickness of reaction products 18 deposited on the inner wall of the window 12 is thicker in portion B than in portion A according to the distribution of reaction products 18 as shown in FIG. 10, the FSV of the second Faraday shield 8b can be set higher than the FSV of the first Faraday shield 8a, to thereby suppress the chipping of the inner wall of the window 12 and to remove the reaction products 18 deposited on the whole surface of the inner wall of the window 12. Further, the respective FSV of the first Faraday shield 8a and the second Faraday shield 8b can be controlled independently by setting the capacitance of VC3 and VC5 as parameters for the processing condition of the plasma processing apparatus. Alternatively, the respective FSV of the first Faraday shield 8a and the second Faraday shield 8b can be controlled independently via a capacitance control means (not shown) of VC3 and VC5. As described, by enabling independent control of the FSV of the first Faraday shield 8a and the FSV of the second Faraday shield 8b, high frequency voltage will not be applied to areas where the thickness of the reaction products is small, therefore, the reaction products attached to the inner wall of the window 12 can be removed uniformly from the whole inner wall area of the window 12. For this reason, the replacement cycle of the window 12 can be elongated. Further, the influence of reaction products on the in-plane distribution of etching rate on the sample surface can be eliminated.

Further according to the present invention, the high frequency power respectively supplied to the first induction antenna 1a, the second induction antenna 1b, the first Faraday shield 8a and the second Faraday shield 8b is supplied only from the first high frequency power supply 10 via a matching box 3. Therefore, unlike the prior art disclosed in patent document 2, it is not necessary to dispose two high frequency power supplies to correspond to the first Faraday shield 8a and the second Faraday shield 8b. Thus, the present embodiment enables to reduce the number of high frequency power supplies, according to which the manufacturing costs of the plasma processing apparatus can be cut down, and the plasma processing apparatus can be cut down since there is no need to ensure a wide mounting space.

The present embodiment illustrates an example where variable capacitors VC3 and VC5 are used as the method for respectively controlling the FSV applied to the first Faraday shield 8a and the second Faraday shield 8b, respectively, but for example, by designing the Faraday shields so that the surface area of the second Faraday shield 8b becomes smaller than the surface area of the first Faraday shield 8a, it becomes possible to set the FSV applied to the second Faraday shield 8b to be higher than the FSV applied to the first Faraday shield 8a.

For this reason, it becomes possible to use a variable capacitor having a small capacitance as the variable capacitor VC5. In contrast, if the FSV applied to the first Faraday shield 8a is to be increased, a variable capacitor having a small capacitance can be used as the variable capacitor VC3.

The present embodiment is applicable either during processing of the sample 13 or during plasma cleaning of the vacuum processing chamber 2.

Example 2

The present embodiment illustrates an application of the present invention in which the FSVs respectively applied to the first Faraday shield 8a and the second Faraday shield 8b have a phase difference. The arrangement of the plasma processing apparatus according to the present invention is as illustrated in FIG. 1, similar to embodiment 1. However, the number of high frequency power supplies for supplying high frequency power to the first induction antenna 1a and the second induction antenna 1b is not limited to one, and can be more than one. Further, the number of matching boxes of the high frequency power supply is not limited to one, and can be more than one.

Figure 2:
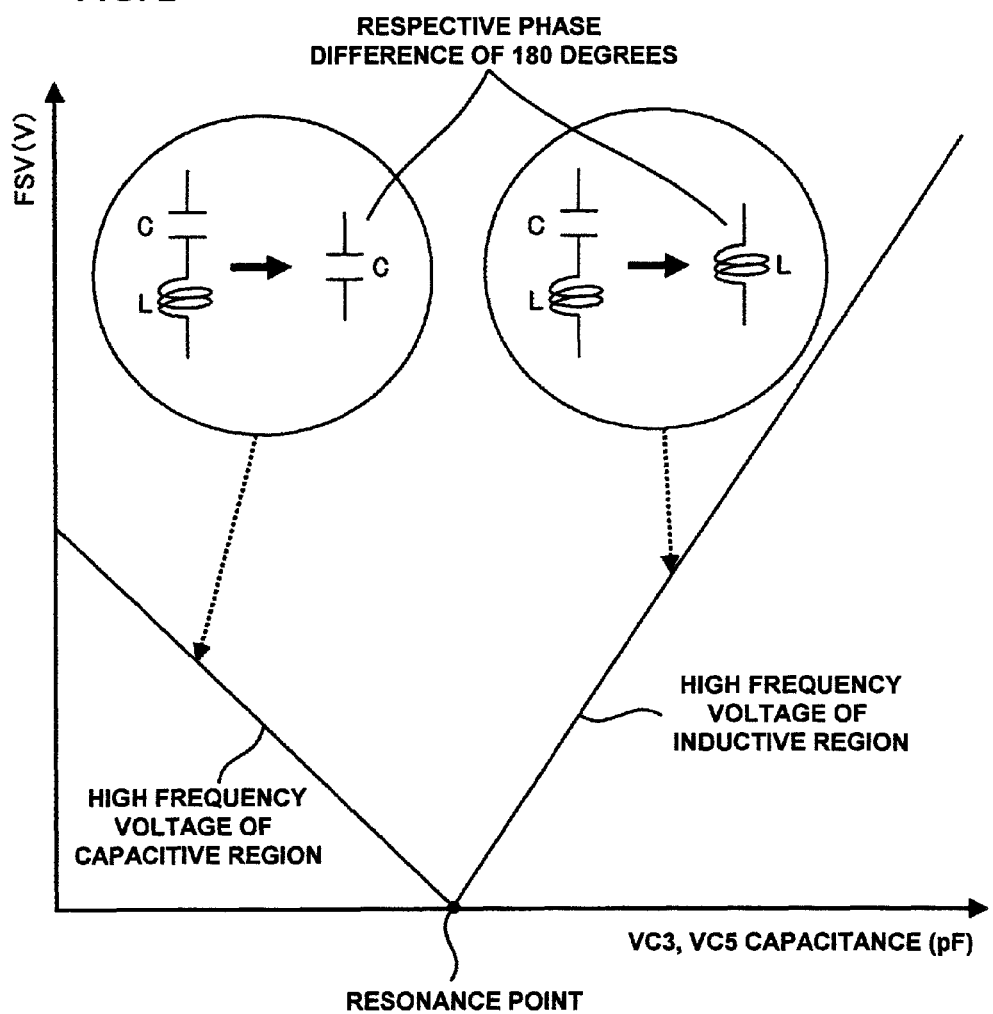
FIG. 2 is a graph showing the range of control of the voltages applied to the Faraday shield according to the preferred embodiment of the present invention.

Now, the principle of operation for providing a phase difference to the phases of the first Faraday shield 8a and the second Faraday shield 8b will be described. As shown in FIG. 1, the respective FSV of the first Faraday shield 8a and the second Faraday shield 8b is controlled via a LC serial resonance circuit composed of the variable capacitor VC3, the inductance $L_2$, the variable capacitor VC5 and the inductance $L_3$. The relationship between the capacitance (pF) and FSV (V) of the variable capacitor VC3 (VC5) is illustrated in FIG. 2. The synthetic impedance of the variable capacitor VC3 (VC5) and the inductance $L_2$ ($L_3$) is represented by expression 2. Further, the capacitance of a resonance point can be obtained via expression 3.

$$Z = j\omega L + \frac{1}{j\omega C} \quad \text{[Expression 2]}$$

$$f = \frac{1}{2p\sqrt{L_2 \cdot VC3}}, f = \frac{1}{2p\sqrt{L_3 \cdot VC5}} \quad \text{[Expression 3]}$$

Based on expression 2, in the resonance point of the variable capacitor VC3 (VC5) and the inductance $L_2$ ($L_3$), FSV=0 (V). If the capacitance of the variable capacitor VC3 (VC5) becomes smaller than the capacitance at the resonance point, the synthetic impedance becomes a capacitive impedance, while on the other hand, if the capacitance of the variable capacitor VC3 (VC5) becomes greater than the capacitance at the resonance point, the synthetic impedance becomes an inductive impedance. Since the phase difference between a capacitive impedance and an inductive impedance is 180 degrees, by controlling the respective FSVs of the first Faraday shield 8a and the second Faraday shield 8b so that the one FSV is a high frequency voltage in the capacitive area and the other FSV is a high frequency voltage in the inductive area, the phase of FSVs respectively applied to the first Faraday shield 8a and the second Faraday shield 8b can be inverted by 180 degrees. Further, in order to set the phase difference of the respective FSVs of the first Faraday shield 8a and the second Faraday shield 8b to 180 degrees, the respective capacitances of VC3 and VC5 are set so that one is a high frequency voltage in the capacitive area and the other is a high frequency voltage in the inductive area. Alternatively, the phases of the respective FSVs of the first Faraday shield 8a and the second Faraday shield 8b can be inverted by 180 degrees by using a capacitance control means (not shown) of VC3 and VC5.

Figure 3:
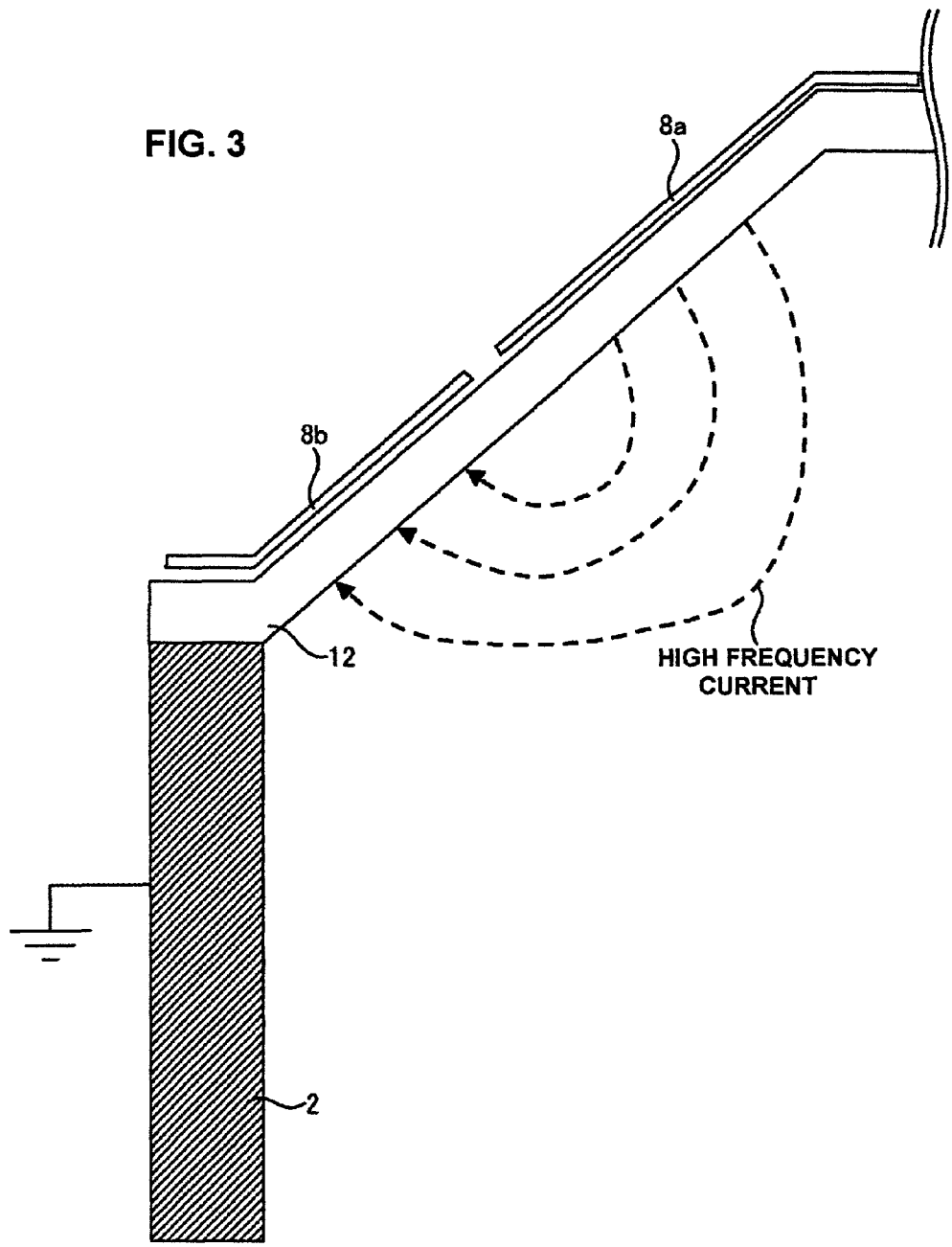
FIG. 3 is a view showing the behavior of plasma current when the phase of the lower Faraday shield is inverted according to the preferred embodiment of the present invention.

FIG. 3 shows a behavior of the high frequency current when the FSVs applied to the first Faraday shield 8a and the second Faraday shield 8b are inverted by 180 degrees. The phase of the FSV applied to the second Faraday shield is inverted by 180 degrees with respect to the phase of the FSV applied to the first Faraday shield 8a. At this time, if the high frequency current flowing from the first Faraday shield 8a into the vacuum processing chamber 2 is the same as the high frequency current flowing from the vacuum processing chamber 2 into the second Faraday shield 8b, the high frequency current flows in the direction of the arrow shown in FIG. 3, substantially enclosing the high frequency current within the inner wall surface of the window 12 (so that high frequency current will not flow from the Faraday shield 8 into the inner wall of the vacuum processing chamber 2).

Figure 4:
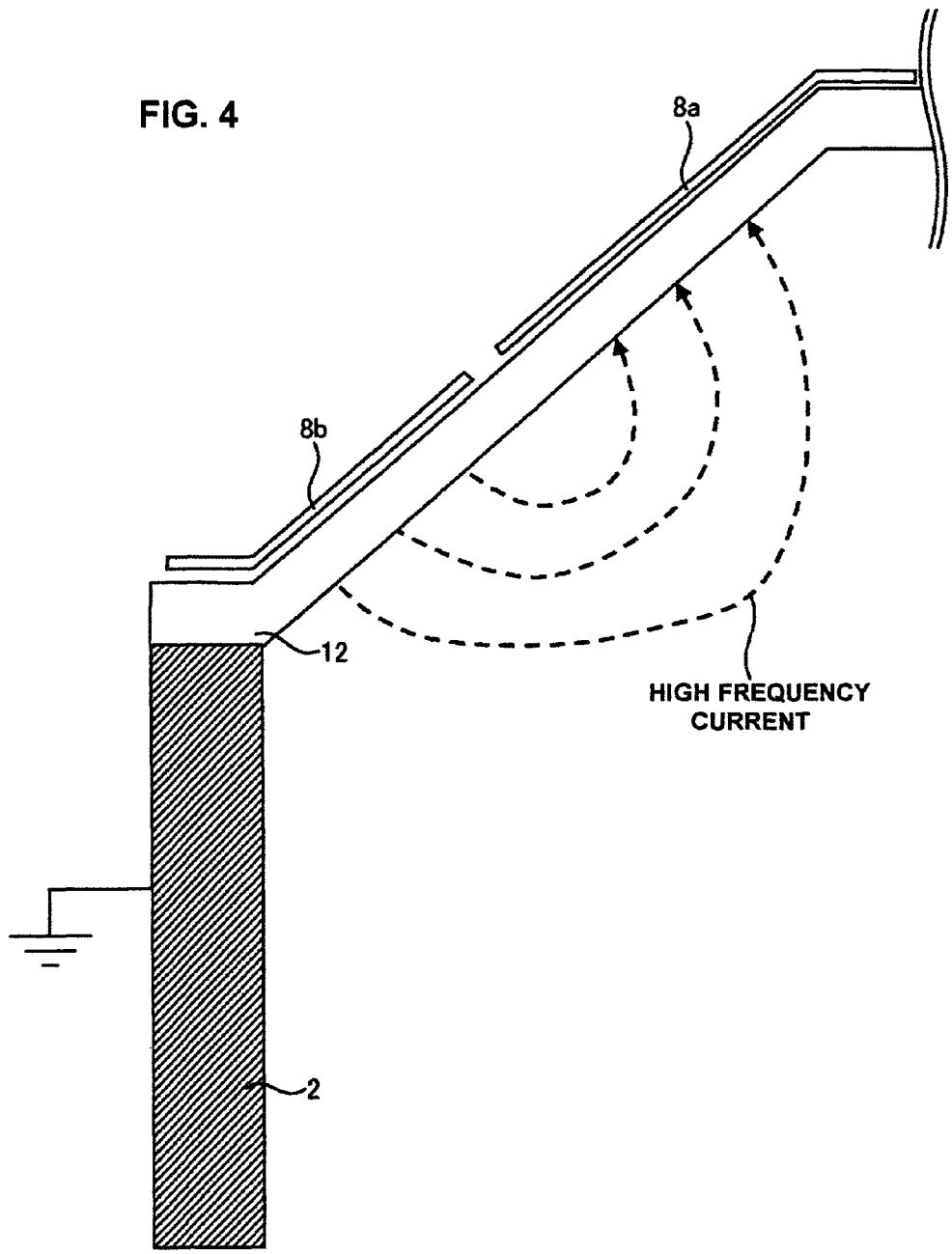
FIG. 4 is a view showing the behavior of plasma current when the phase of the upper Faraday shield is inverted according to the preferred embodiment of the present invention.

FIG. 4 illustrates a case where the phases of the respective FSVs of the first Faraday shield 8a and the second Faraday shield 8b are further inverted by 180 degrees, according to which the high frequency current can be substantially enclosed within the inner wall surface of the window 12 similar to FIG. 3, but with the direction of the high frequency current reversed (so that high frequency current will not flow from the Faraday shield 8 into the inner wall of the vacuum processing chamber 2).

Figure 5:
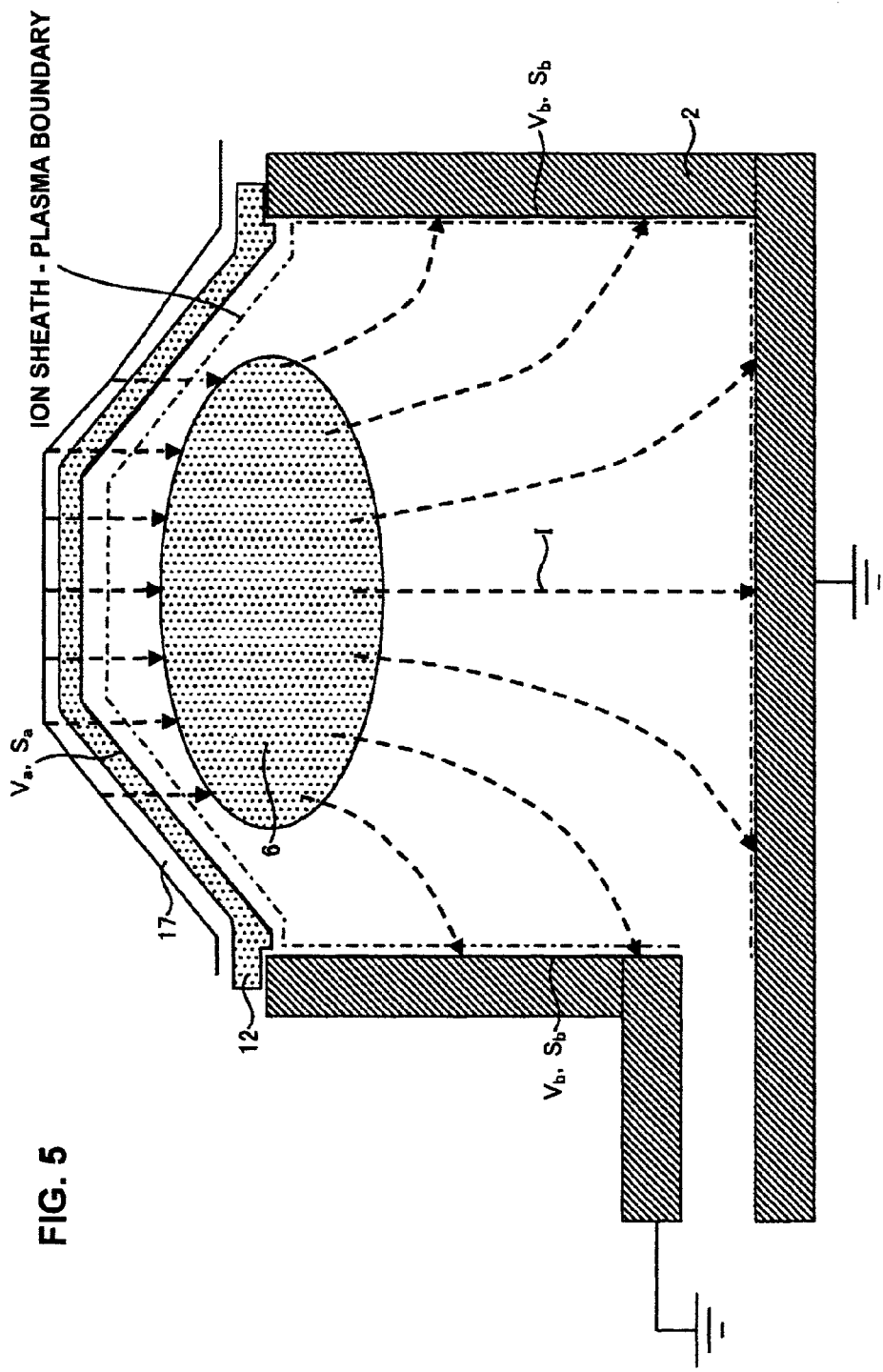
FIG. 5 is a view showing the flow of current occurring in the vacuum processing chamber during plasma processing.
Figure 6:
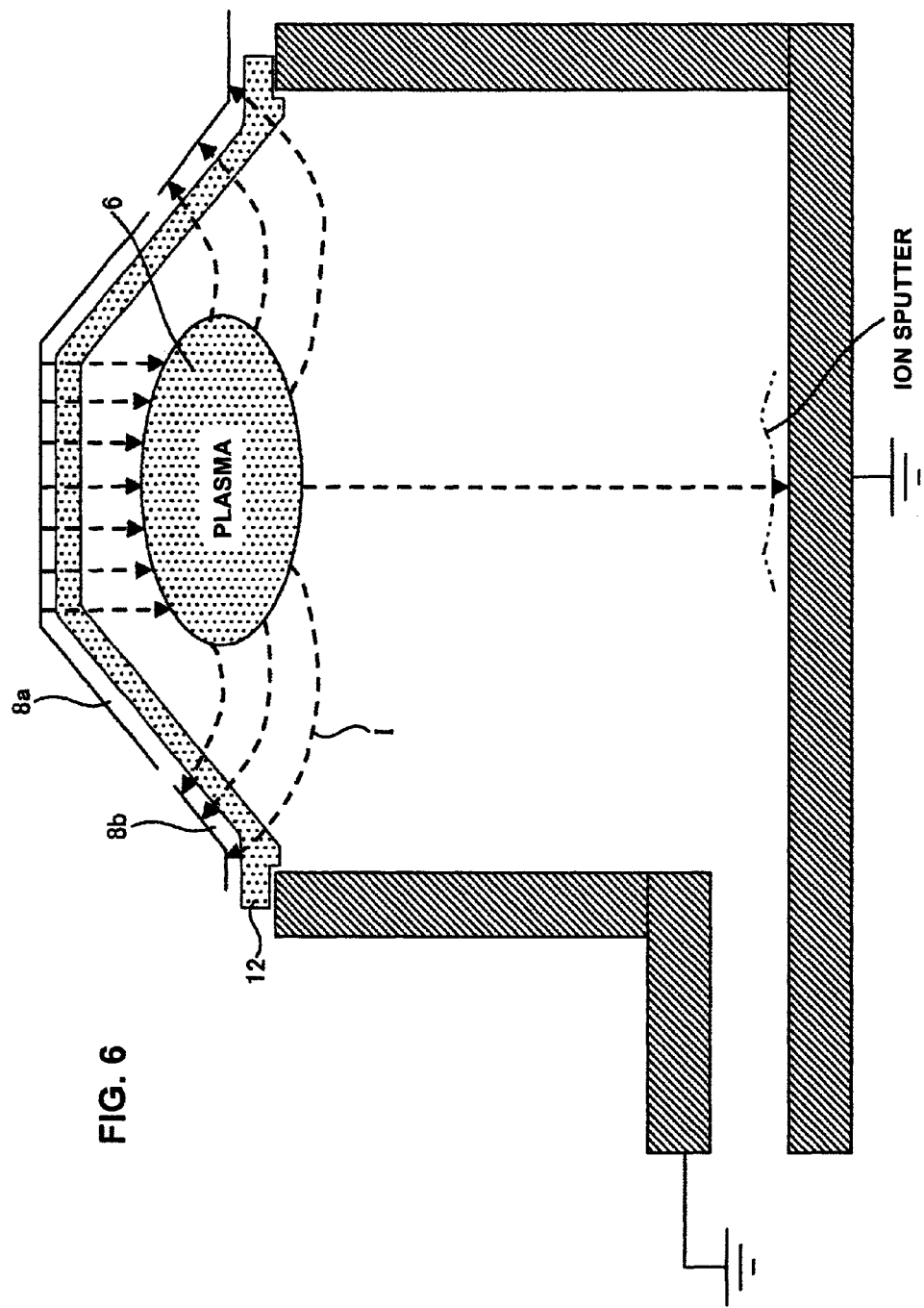
FIG. 6 is a view showing the flow of current occurring in the vacuum processing chamber during plasma processing according to the preferred embodiment of the present invention.

Unlike FIGS. 3 and 4, if the respective phases of the high frequency currents of the first Faraday shield 8a and the second Faraday shield 8b are the same, the high frequency current flown to the first Faraday shield 8a (second Faraday shield 8b) cannot be cancelled by the high frequency current of the second Faraday shield 8b (first Faraday shield 8a). Therefore, the high frequency current flowing to the first Faraday shield 8a is all flown into the inner wall of the vacuum processing chamber 2, as shown in FIG. 5. On the other hand, when the phases of the high frequency currents applied to the first Faraday shield 8a and the second Faraday shield 8b are inverted by 180 degrees, and the absolute values of the current values differ, the remaining high frequency current that could not be cancelled flows into the inner wall of the vacuum processing chamber 2, as shown in FIG. 6. In this case, the absolute value of the current of the high frequency current flowing into the inner wall surface of the vacuum processing chamber 2 is small, so the self bias generated at the inner wall surface of the vacuum processing chamber 2 is reduced. Therefore, the sputtering of the inner wall of the vacuum processing chamber 2 can be suppressed. For this reason, the consumption of parts constituting the interior of the vacuum processing chamber 2 or the chipping of the inner wall surface of the vacuum processing chamber 2 can be suppressed. An example where the phase difference between the respective FSVs of the first Faraday shield 8a and the second Faraday shield 8b is 180 degrees has been described according to the present embodiment, but the phase difference is not restricted to 180 degrees. By providing a phase difference using a phase control means (not shown) to the respective FSVs of the first Faraday shield 8a and the second Faraday shield 8b, the high frequency current flowing into the inner wall of the vacuum processing chamber 2 can be reduced compared to the case where the phases are the same, so that the self bias generated at the inner wall surface of the vacuum processing chamber 2 can be reduced. Therefore, the sputtering of the inner wall of the vacuum processing chamber 2 can be suppressed. For this reason, the consumption of parts constituting the interior of the vacuum processing chamber 2 or the chipping of the inner wall surface of the vacuum processing chamber 2 can be suppressed.

Further, by setting the surface areas of the first Faraday shield 8a and the second Faraday shield 8b as S1 and S2 and the respective FSVs of the first Faraday shield 8a and the second Faraday shield 8b as FSV1 and FSV2, respectively applying a most suitable high frequency voltage to the first Faraday shield 8a and the second Faraday shield 8b in response to the distribution of reaction products on the inner wall of the window 12, providing a phase difference between FSV1 and FSV2, and adjusting the surface area ratio (S1/S2) of the first Faraday shield 8a and the second Faraday shield 8b to satisfy expression 4, high frequency currents having equal absolute values can be supplied to the first Faraday shield 8a and the second Faraday shield 8b while maintaining the respective FSVs of the first Faraday shield 8a and the second Faraday shield 8b to appropriate high frequency voltages in response to the distribution of reaction products deposited on the inner wall of the window 12. For this reason, the high frequency current flowing into the inner wall of the vacuum processing chamber 2 can be reduced further compared to the case where the absolute values of the current value supplied to the first Faraday shield 8a and the second Faraday shield 8b differ and a phase difference is set to FSV1 and FSV2, so that the self bias generated at the inner wall surface of the vacuum processing chamber 2 can be further reduced. Therefore, the present embodiment enables to suppress the sputtering of the inner wall of the vacuum processing chamber 2, the consumption of components constituting the interior of the vacuum processing chamber 2 and the chipping of the inner wall surface of the vacuum processing chamber 2, compared to the case where the absolute values of the currents flowing to the first Faraday shield 8a and the second Faraday shield 8b differ and a phase difference is set to FSV1 and FSV2. The consumption of parts constituting the interior of the vacuum processing chamber 2 or the chipping of the inner wall surface of the vacuum processing chamber 2 can be suppressed most when the above-described phase difference is set to 180 degrees.

The present embodiment is applicable during processing of the sample 13 or during plasma cleaning of the vacuum processing chamber 2.

$$\frac{FSV2}{FSV1} = \left(\frac{S1}{S2}\right)^n \qquad [\text{Expression 4}]$$

Next, the structure of the first Faraday shield 8a and the second Faraday shield 8b according to the first and second embodiments of the present invention will be described with reference to FIGS. 7 and 8.

Figure 7:
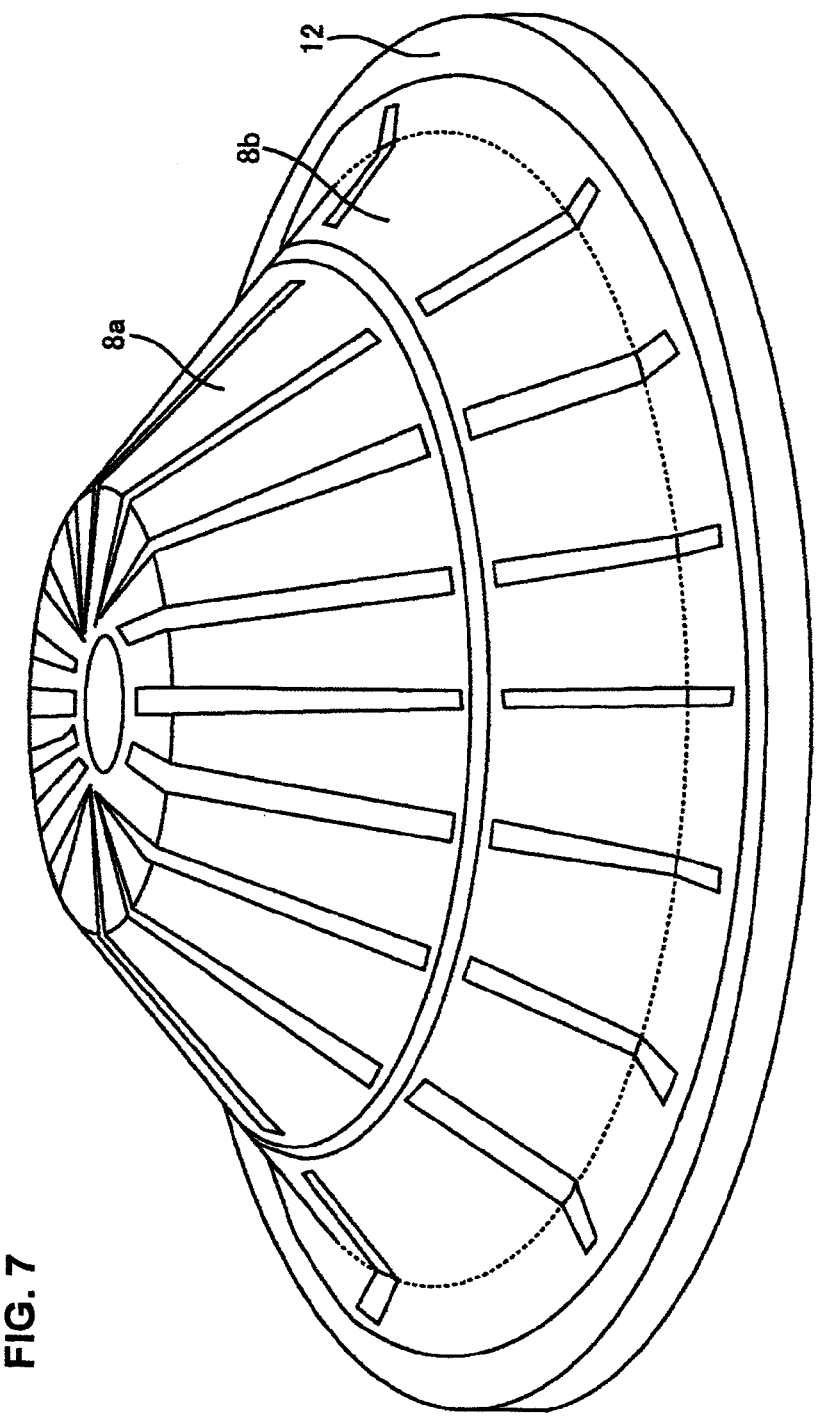
FIG. 7 is a view showing the structure of a divided Faraday shield according to the preferred embodiment of the present invention.
Figure 8:
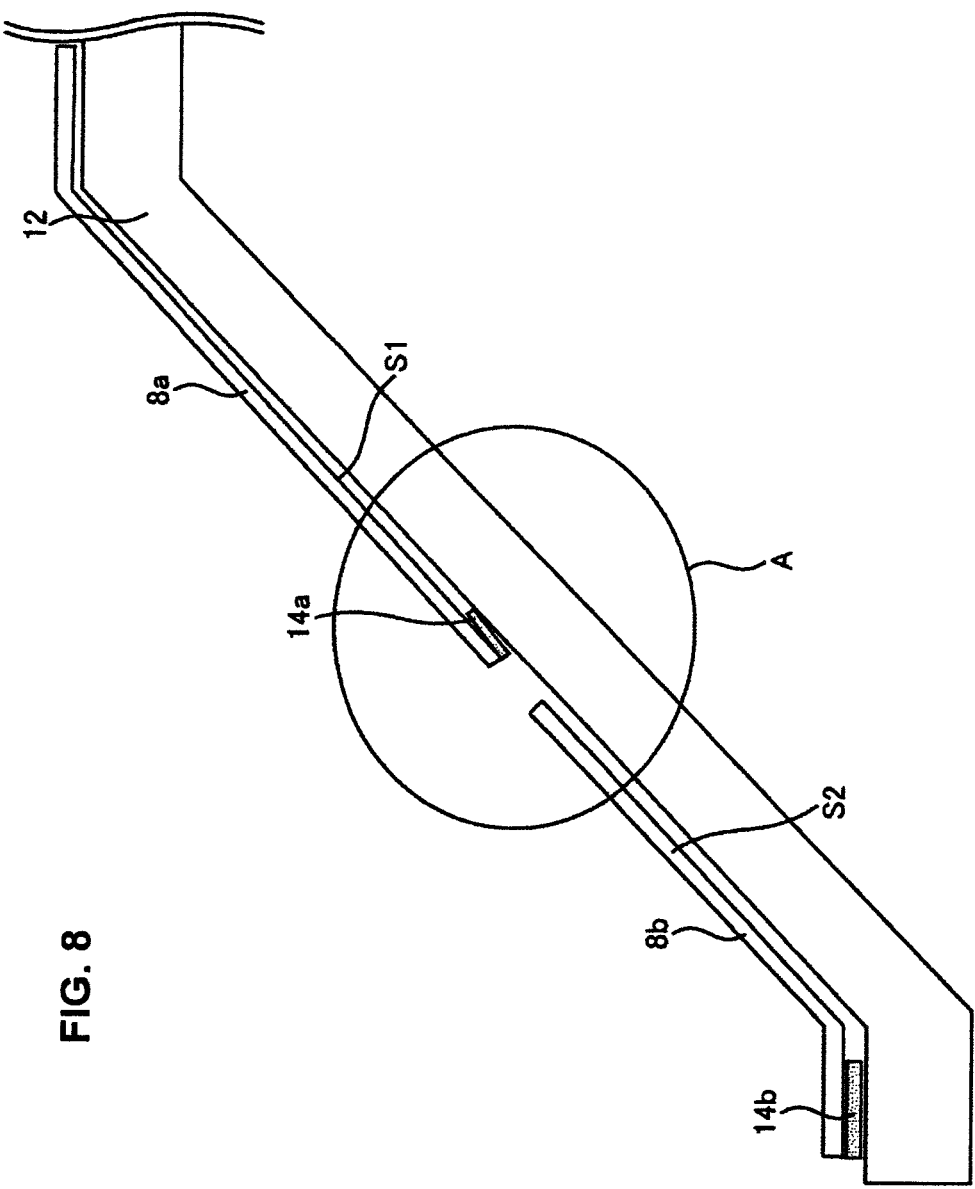
FIG. 8 is a cross-sectional view showing the peripheral area of a trapezoidal vacuum chamber having arranged thereon the divided Faraday shield according to the preferred embodiment of the present invention.

As shown in FIGS. 7 and 8, the first Faraday shield 8a and the second Faraday shield 8b are formed of metallic conductors having vertically-striped slits orthogonal to the first induction antenna 1a and the second induction antenna 1b, which are arranged in overlapped manner to the outer side of the window 12. Further, the first Faraday shield 8a and the second Faraday shield 8b can be formed via thermal spraying on the outer surface of the window 12. When the Faraday shield 8 is formed via thermal spraying, the clearance between the Faraday shield 8 and the window 12 can be made constant or minimized, so that abnormal discharge between the induction antenna 1 and the Faraday shield 8 can be suppressed, and the plasma can be ignited via a low power.

Figure 9:
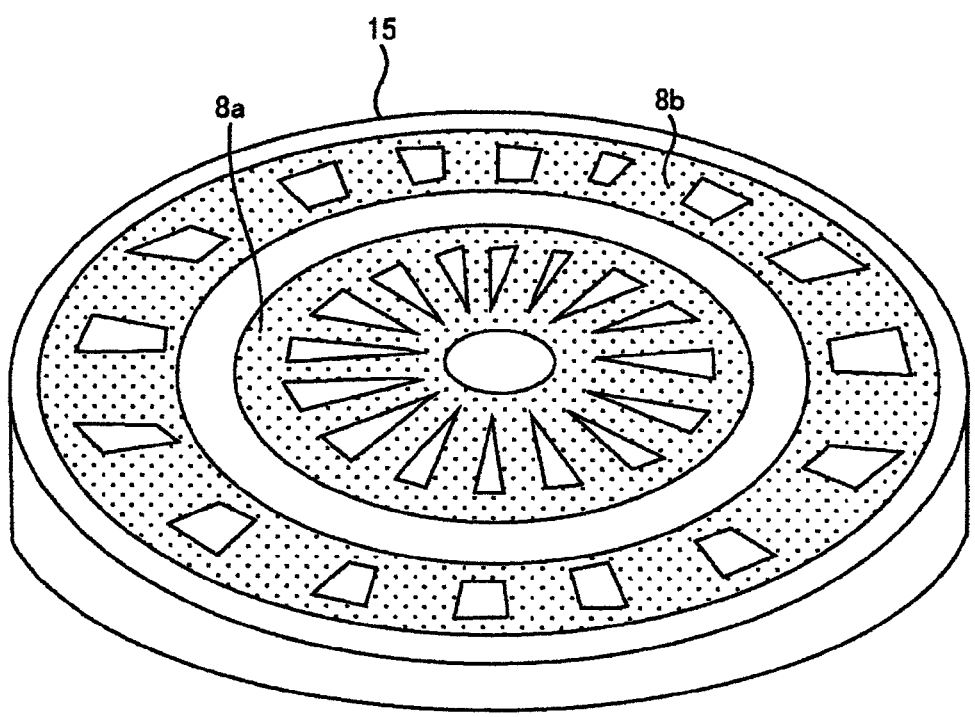
FIG. 9 is a cross-sectional view showing the peripheral area of a parallel plate type vacuum chamber having arranged thereon the divided Faraday shield according to the preferred embodiment of the present invention.

Further, the shapes of the first Faraday shield 8a and the second Faraday shield 8b can be varied to correspond to the shape of the window 12. For example, the shape of the Faraday shield can be altered to correspond to the parallel plate-type window 15 as shown in FIG. 9, according to which the mounting space thereof can be reduced compared to the Faraday shield 8 shown in FIG. 7. Moreover, the division number of the Faraday shield can be varied if necessary. For example, the Faraday shield can be divided into three parts. The necessary conditions for this example is to rectify the FSVs of the respective Faraday shields, and to determine the areas of the Faraday shields so that the sum of the high frequency currents flowing through the three Faraday shields becomes zero. An example of the method for setting the sum of the high frequency current to zero sets the high frequency currents of two Faraday shields to have the same phase and the remaining Faraday shield to have an inverted phase, according to which the sum of the respective high frequency currents is set to zero. Further, the combination of the phases and current values of the high frequency currents is not restricted to the above example. The present example enables to control the FSVs with higher precision in response to the distribution of reaction products deposited on the inner wall surface of the window 12 compared to the case where the Faraday shield is divided into two parts.

As shown in FIG. 8, since the shapes of the first Faraday shield 8a and the second Faraday shield 8b are unique, the Faraday shields will be deformed if excessive force is applied during the manufacturing and assembling processes. In order to prevent such deformation, a first Faraday shield ring 14a and a second Faraday shield ring 14b formed of insulating material (such as a Bakelite) or metallic material (such as SUS) can be disposed on the respective outermost circumferences of the first Faraday shield 8a and the second Faraday shield 8b, to thereby secure the shields.

The metallic Faraday shield ring 14 is more preferable, since the metallic Faraday shield ring 14 has higher shielding effect than the insulative Faraday shield ring 14.

What is claimed is:

1. A plasma processing apparatus comprising:
a vacuum processing chamber;
a vacuum processing chamber lid sealing an upper portion of the vacuum processing chamber;
a first induction antenna arranged above the vacuum processing chamber lid;
a second induction antenna arranged above the vacuum processing chamber lid and arranged outside of the first induction antenna;
a first Faraday shield disposed between the first induction antenna and the vacuum processing chamber lid;
a second Faraday shield disposed between the second induction antenna and the vacuum processing chamber lid; and a high frequency power supply for supplying high frequency power to the first induction antenna and the second induction antenna via a matching box;
wherein the first Faraday shield and the second Faraday shield are applied with high frequency voltage from the high frequency power supply via the matching box;
wherein the matching box is equipped with a first LC circuit which controls a first high frequency voltage to be applied to the first Faraday shield and which comprises a first variable capacitor and a first inductance, and a second LC circuit which controls a second high frequency voltage to be applied to the second Faraday shield and which comprises a second variable capacitor and a second inductance;
wherein the plasma processing apparatus further comprises a capacitance control device configured to set a capacitance of the second variable capacitor to a capacitance larger than a capacitance at a resonance point of the second LC circuit, in a case where a capacitance of the first variable capacitor is set to a capacitance smaller than a capacitance at a resonance point of the first LC circuit, and to set the capacitance of the second variable capacitor to a capacitance smaller than the capacitance at the resonance point of the second LC circuit, in a case where the capacitance of the first variable capacitor is set to a capacitance larger than the capacitance at the resonance point of the first LC circuit.

2. The plasma processing apparatus according to claim 1, wherein when a surface area of the first Faraday shield and a surface area of the second Faraday shield are denoted by S1 and S2, respectively, and the first high frequency voltage and the second high frequency voltage are denoted by FSV1 and FSV2, respectively, the surface areas of the first Faraday shield and the second Faraday shield satisfy the following expression:

$$\frac{FSV2}{FSV1} = \left(\frac{S1}{S2}\right)^n. \qquad \text{[Expression 4]}$$

3. The plasma processing apparatus according to claim 1, wherein the capacitance control device enables suppression of self bias generated at the inner wall surface of the vacuum processing chamber to thereby suppress chipping of the inner wall of the vacuum processing chamber and inner components of the vacuum processing chamber, and suppression of generation particles by suppressing the chipping of the inner wall of the vacuum processing chamber and the inner components of the vacuum processing chamber.

* * * * *